United States Patent [19]
Ina

[11] Patent Number: 6,100,010
[45] Date of Patent: Aug. 8, 2000

[54] PHOTORESIST FILM AND METHOD FOR FORMING PATTERN THEREOF

[75] Inventor: Katsuyoshi Ina, Iwakura, Japan

[73] Assignee: Sharp Kabushiki Kaisha, Osaka, Japan

[21] Appl. No.: 09/255,757

[22] Filed: Feb. 23, 1999

[30] Foreign Application Priority Data

Feb. 23, 1998 [JP] Japan .................................. 10-040012

[51] Int. Cl.⁷ ........................................................ G03F 7/26
[52] U.S. Cl. ...................... 430/273.1; 430/312; 430/313; 430/325
[58] Field of Search ................................ 430/312, 313, 430/325, 273.1

[56] References Cited

U.S. PATENT DOCUMENTS

| | | | |
|---|---|---|---|
| 4,370,405 | 1/1983 | O'Toole et al. | 430/312 |
| 4,591,546 | 2/1999 | West et al. | 430/270 |
| 5,871,886 | 2/1999 | Yu et al. | 430/316 |

FOREIGN PATENT DOCUMENTS

7-142365  6/1995  Japan .

*Primary Examiner*—Janet Baxter
*Assistant Examiner*—Rosemary Ashton
*Attorney, Agent, or Firm*—Nixon & Vanderhye, P.C.

[57] ABSTRACT

A photoresist includes a three-layer structure of a lower layer, a middle layer and an upper layer, wherein the lower and upper layers are photoresist layers, the lower layer is sensitive to a light having a longer wavelength than a light to which the upper layer is sensitive, and the middle layer is a light-shielding film formed of an organic substance that has a transmittance such that the lower layer is not exposed to lights to which the lower and upper layers are sensitive.

11 Claims, 5 Drawing Sheets

PHOTORESIST FILM AND METHOD FOR FORMING PATTERN THEREOF

CROSS-REFERENCES TO RELATED APPLICATIONS

This application is related to Japanese patent application No. HEI 10-040012 filed on Feb. 23, 1998 whose priority is claimed under 35 USC §119, the disclosure of which is incorporated herein by reference in its entirety.

BACKGROUND OF THE INVENTION

1. Field of the Invention

The present invention relates to a photoresist film and a method for formation of a pattern for the photoresist film.

2. Description of the Related Art

Large-scale integrated semiconductor circuits (hereafter referred to as "LSIs") are becoming more and more highly integrated in recent years, requiring scale reduction to a size smaller than the design rule. As a light source to be used in a photolithography step, a mercury lamp (i-beam; 365 nm) or a KrF excimer laser (248 nm) is becoming prevalent. However, a design rule to be expected in the future (0.2 $\mu$m or less) requires formation of a pattern of a size less than the wavelengths of these light sources, so that a new method must be developed.

An approach to this demand using a mono-layer resist film is now being studied along the following line. Namely, a method of using the deformation radiation or phase shift method in combination with the KrF excimer laser is now studied as the first method. This method achieves a resolution of 0.14 $\mu$m with a film thickness of 1000 Å. Also, a method of adopting an ArF excimer laser (193 nm) as a new light source is now being studied as the second method. The ArF excimer laser achieves a resolution of 0.12 $\mu$m with a film thickness of 1000 Å. For use in the future, a method of using the deformation radiation or phase shift method in combination with the ArF excimer laser is studied as the third method. This method achieves a resolution of 0.1 $\mu$m with a film thickness of 1000 Å.

When these methods are used, it is possible to form a very fine pattern with a resolution of 0.15 $\mu$m or less if the film thickness is not considered. Actually, however, an etching step must be carried out after the photoresist film is patterned, so that the thickness of the photoresist film must be at least 5000 Å. The resolution for this film thickness of 5000 Å is 0.18 $\mu$m by the first method, 0.16 $\mu$m by the second method, and 0.14 $\mu$m by the third method. Therefore, according as the thickness of the photoresist film increases, the resolution becomes worse than the original resolution (achieved by the thickness of 1000 Å) by about 0.04 $\mu$m. In other words, as long as a pattern is formed using a conventional mono-layer photoresist film, the thickness of the photoresist film is determined by taking account of the resistance to etching in the next step, so that the advantage of fine resolution is not sufficiently drawn out yet.

On the other hand, a patterning method known as the surface modification method is studied, in which the surface of a photoresist film is silylated after the exposure to light, and then a dry development is carried out to form a pattern having a high resolution and excellent resistance to dry etching. According to this technique, an initial pattern is formed in a region of about 1000 Å thickness within the surface of the photoresist film, so that the resolution is higher than the one achieved by the conventional methods. Also, since the silylated layer formed in the surface can firmly protect the lower layer, the pattern can be made to have an excellent resistance to dry etching. However, at the dry development step, a plasma cuts a sidewall of the photoresist layer under the silylated layer, thereby forming a tapered cross section. Also, because of an inherent property that the formation of the silylated surface proceeds by diffusion within the substance, the stability of the pattern dimension is poor, so that the method is hardly practicable.

Figure 5:
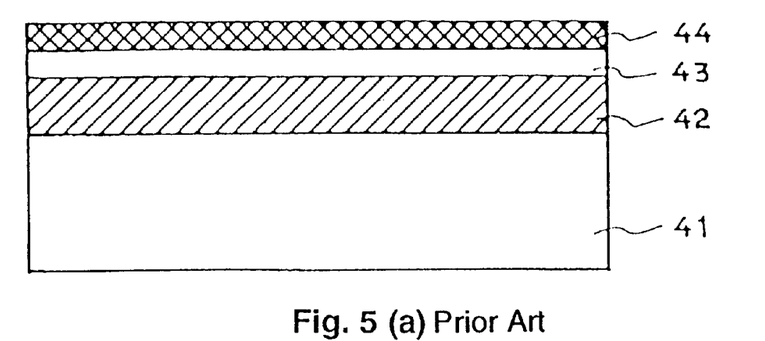
FIGS. 5(a) to 5(c) are cross-sectional views each showing a part of the steps for forming a pattern of a conventional photoresist film.

Accordingly, a patterning method using a multi-layer photoresist is now being developed. For example, in a method disclosed in Japanese Unexamined Patent Publication No. Hei 7(1995)-142365, a lower resist layer 43 which is sensitive to the i-beam is formed on a film 42 to be etched in a later step, and an upper resist layer 44 which is sensitive to the KrF excimer laser beam is mounted on the lower resist layer 43 (FIG. 5(a)). Subsequently, a KrF excimer laser beam is applied using a mask, followed by development to pattern only the upper resist layer 44 (FIG. 5(b)). Then, the i-beam is applied over an entire surface, followed by development. However, although a pattern can be formed in principle by this method, the applied beam cannot be completely shielded by the upper resist layer 44 at the second exposure step using the i-beam, so that as a result the lower resist layer 43 as a whole is exposed to the i-beam, thus making a line width of the lower resist layer 43 non-uniform and making it difficult to form a good pattern, as shown in FIG. 5(c). Here, in FIGS. 5(a) to 5(c), the reference numeral 41 represents a wafer substrate.

Therefore, at present, a photoresist film that overcomes the problem of decrease in the resolution due to the thickness of the photoresist film has not been developed yet.

SUMMARY OF THE INVENTION

The present invention has been made in view of these circumstances and the purpose thereof is to provide a photoresist film that can be patterned without causing decrease in the resolution due to the thickness of the photoresist film and without deteriorating the resistance to dry etching in forming a pattern using an exposure light such as a KrF or ArF excimer laser beam, and a method for forming a pattern therefor.

Accordingly, the present invention provides a photoresist film comprising a three-layer structure of a lower layer, a middle layer and an upper layer, wherein the lower and upper layers are photoresist layers, the lower layer is sensitive to a light having a longer wavelength than a light to which the upper layer is sensitive, and the middle layer is a light-shielding film formed of an organic substance that has a transmittance such that the lower layer is not exposed to lights to which the lower and upper layers are sensitive.

Also, the present invention provides a method of forming a pattern of a photoresist film comprising the steps of: forming the photoresist film of these layer structure as mentioned above on a layer to be etched; patterning only the upper layer by applying a light to which the upper layer is sensitive, using a mask of a predetermined shape; etching the middle layer which has been exposed at the patterning step, until a surface of the lower layer is exposed; and applying a light to which the lower layer is sensitive, over an entire surface to pattern the lower layer.

BRIEF DESCRIPTION OF THE DRAWINGS

The present invention will be better understood from the following detailed description of preferred embodiments of the invention, taken in conjunction with the accompanying drawings, in which.

DETAILED DESCRIPTION OF THE PREFERRED EMBODIMENTS

The present invention will be detailed by way of Examples shown below. However, these Examples are not intended to limit the scope of the present invention.

Figure 1:
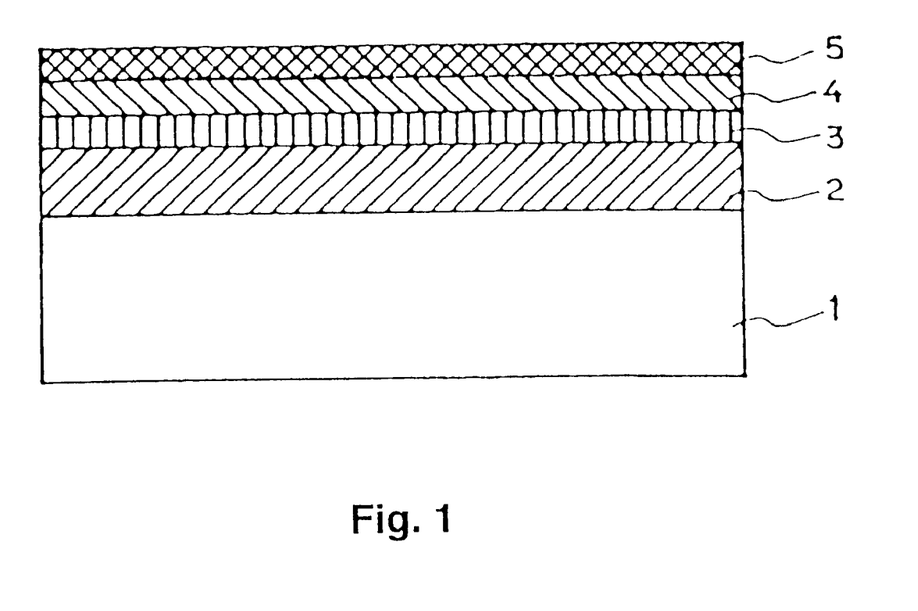
FIG. 1 is a view showing a state in which a photoresist film of the present invention is formed on a film to be etched.
Figure 2:
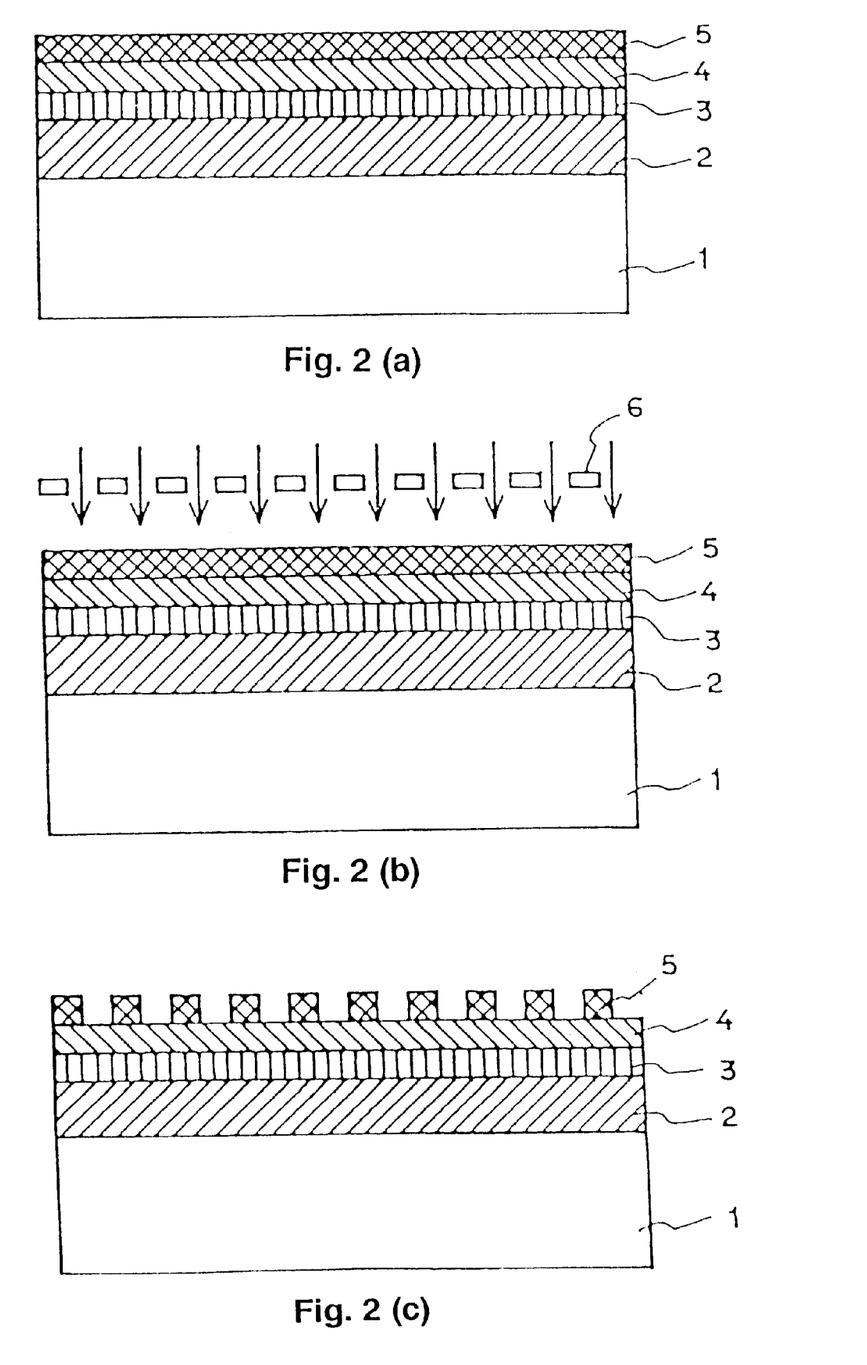
FIGS. 2(a) to 2(c) are cross-sectional views each showing a part of the steps for forming a pattern of the photoresist film of the present invention.
Figure 3:
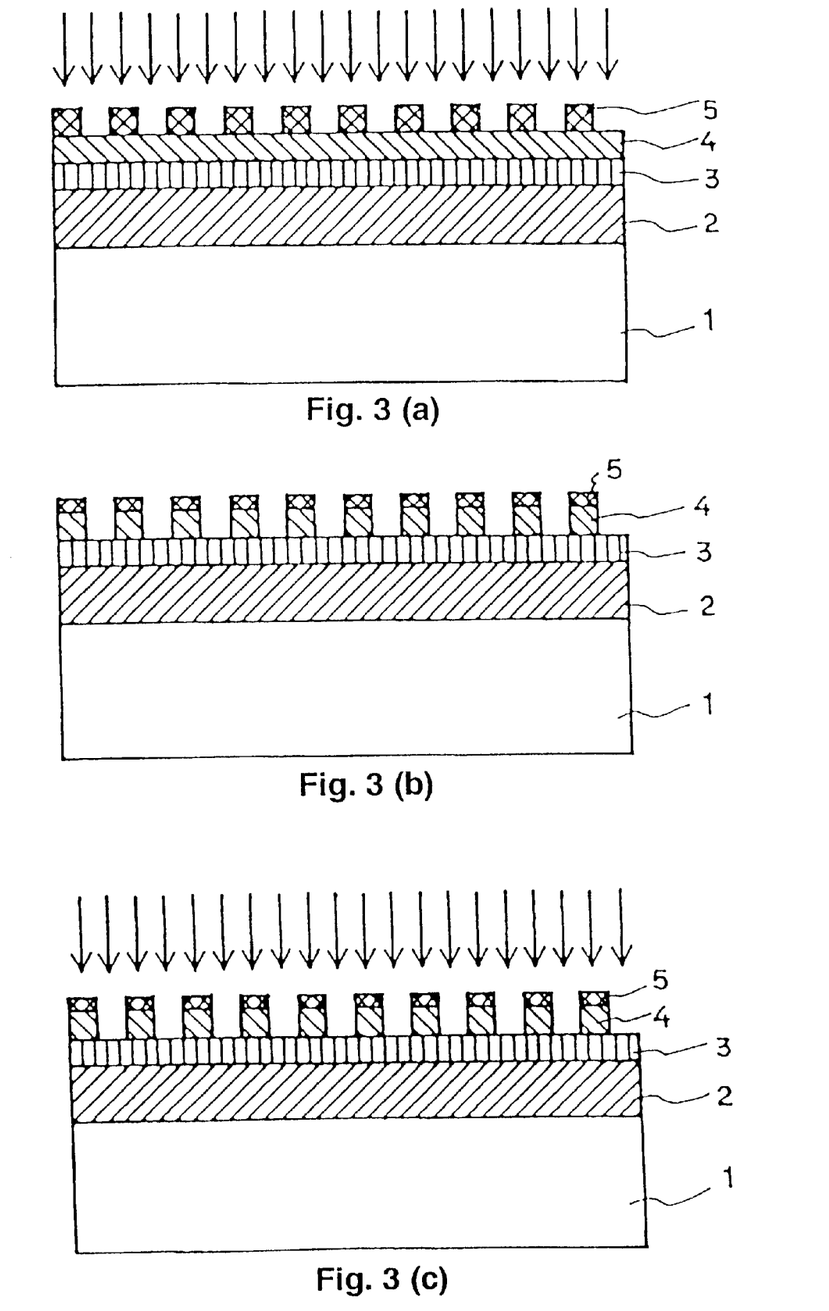
FIGS. 3(a) to 3(c) are cross-sectional views each showing a part of the steps for forming a pattern of the photoresist film of the present invention.
Figure 4:
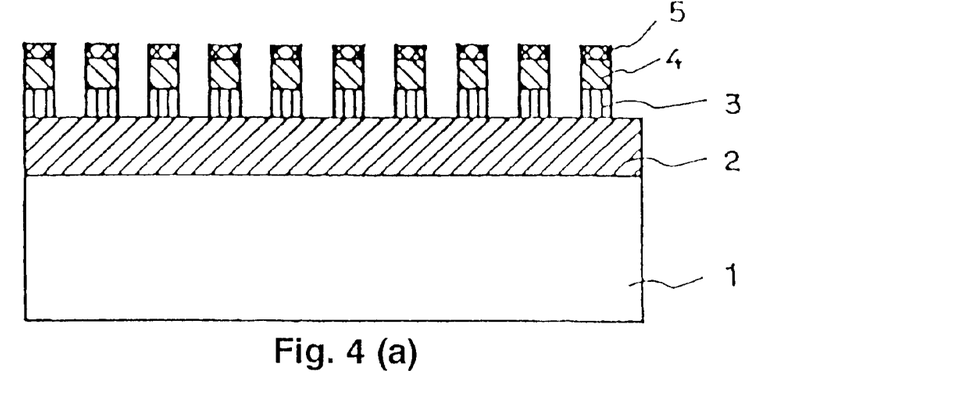
FIGS. 4(a) to 4(c) are cross-sectional views each showing a part of the steps for forming a pattern of the photoresist film of the present invention.

FIG. 1 is a view showing a state in which a photoresist film of the present invention is formed on a layer to be etched; and FIGS. 2(a) to 4(c) are cross-sectional views each showing a part of the steps for forming a pattern of the photoresist film of the present invention. In FIGS. 1 to 4(c), a wafer substrate 1, a film 2 to be etched, a lower layer 3, a middle layer 4, an upper layer 5, and a mask 6 are shown.

The layer to be etched is a layer on which a pattern in a desired configuration is to be formed by photolithography and etching. This layer is typically formed on a semiconductor substrate directly or with intervention of one or more of a device such as a transistor or a capacitor, an insulating film, a conductive layer and the like, but may be a semiconductor substrate itself. The layer to be etched may be formed of a metal such as aluminum, copper, silver, gold or platinum, a high-melting point metal such as tungsten, tantalum, cobalt or titanium, an alloy containing such a metal, a polysilicon, a silicide or polycide composed of polysilicon and such a metal, or the like. The thickness of the layer is not particularly limited.

First, referring to FIG. 1, the photoresist film of the present invention has a three-layer structure of the lower layer 3, the middle layer 4 and the upper layer 5. The lower layer 3 is a photoresist layer that is sensitive to an i-beam or a KrF excimer laser beam. The middle layer 4 is a light-shielding film formed of an organic substance that has a transmittance such that the lower layer is not exposed to light to which the lower and upper layers are sensitive. The upper layer 5 is a photoresist layer that is sensitive to a KrF excimer laser beam or an ArF excimer laser beam. Here, the transmittance is preferably 50% or less. Here, although the light to which the lower and upper layer are sensitive are specifically shown in this specification, they are merely for exemplifying purposes and the lights to be used are not specifically limited as long as the wavelength of the light to which the lower layer is sensitive is longer than the wavelength of the light to which the upper layer is sensitive.

The middle layer 4 is preferably formed of an organic substance from the view point of the facility in forming, the damages to the lower layer and the resistance to dry etching. If the middle layer 4 is formed of an inorganic substance, control of the film thickness is difficult, the lower layer is liable to be damaged at the time of forming the middle film 4, and moreover the etching rate is slow with respect to the resistance to dry etching, so that inorganic substances are not suitable as the material for the middle layer of the photoresist film of the present invention.

A method for forming a pattern of the photoresist film of the present invention will now be explained. First, the photoresist film is formed on the film 2 to be etched, as shown in FIG. 2(a). Then, the upper layer 5 of the photoresist film is exposed to a KrF excimer laser beam or an ArF excimer laser beam (hereafter referred to as "first exposure") by means of the mask 6 (FIG. 2(b)), followed by development to pattern only the upper layer 5 (hereafter referred to as "first patterning") (FIG. 2(c)). Thus, only the upper layer 5 is patterned to separate the upper layer 5 into a portion where the upper layer 5 is removed to expose the underlying middle layer 4 to ambient atmosphere and a portion where the upper layer 5 remains as it is. At this stage, the lower layer 3 and the middle layer 4 are not patterned at all.

Therefore, the upper layer 5 of the photoresist film of the present invention is preferably made of a photoresist layer that is sensitive to the KrF excimer laser beam or the ArF excimer laser beam. This resist may be either a positive type or a negative type. On the contrary, the middle layer 4 must shield the light so that the lower layer 3 is not exposed to the light at the first exposure step.

Next, the entire surface is subjected to an etching treatment by means of an oxygen plasma generating apparatus (FIG. 3(a)). The etching treatment is carried out to such a degree that the middle layer 4 exposed to ambient atmosphere after the first patterning step is completely removed whereas the middle layer 4 under the remaining portion of the upper layer 5 is not completely removed (FIG. 3(b)). Hereafter, the etching treatment under this condition is referred to as "half etching".

Subsequently, the entire surface is exposed to the i-beam or the KrF excimer laser beam (hereafter referred to as "second exposure") without using a mask (FIG. 3(c)), followed by development to pattern the lower layer 3 (hereafter referred to as "second patterning") (FIG. 4(a)). At the second exposure step, the lower layer 3 under the middle layer 4 is not exposed to the light because the light is shielded by the portion of the upper layer 5 remaining after the first patterning step, i.e. by the portion of the middle layer 4 remaining after the half etching step.

On the other hand, the lower layer 3 is exposed to the light by the second exposure at the portion of the middle layer 4 which is exposed to ambient atmosphere after the first patterning, i.e. at the portion of the lower layer 3 which is exposed to ambient atmosphere by complete removal of the middle layer 4 after the half etching step (the exposed portion of the lower layer 3 appearing after the half etching step). Therefore, the middle layer 4 of the photoresist film of the present invention must shield the lights (radiated beams) both at the first and second exposure steps. In other words, if the first exposure uses the KrF excimer laser beam and the second exposure uses the i-beam, the transmittance of the middle layer 4 to each one of the i-beam and the KrF excimer laser beam is preferably 50% or less. If the first exposure uses the ArF excimer laser beam and the second exposure uses the KrF excimer laser beam, the transmittance of the middle layer 4 to each one of the ArF excimer laser beam and the KrF excimer laser beam is preferably 50% or less. If the first exposure uses the ArF excimer laser beam and the second exposure uses the i-beam, the transmittance of the middle layer 4 to each one of the i-beam and the ArF excimer laser beam is preferably 50% or less.

Also, the lower layer 3 of the photoresist film of the present invention is preferably made of a photoresist layer which is sensitive to the KrF excimer laser beam or the i-beam.

After the photoresist pattern is formed (FIG. 4(b)), ordinary LSI manufacturing steps are carried out to etch the film 2 formed on the wafer substrate 1 (FIG. 4(c)). The resistance to etching after the final patterning step of the present invention is borne by all of the remaining three-layers. Further, even after the etching step is ended, the lower layer 3 continues to exist to prevent the film 2 under the remaining portion of the resist from being etched.

As described above, according to the method of forming a photoresist pattern of the present invention, the lower layer 3 is patterned in the end (separated into the remaining portion of the lower layer 3 and the removed portion of the lower layer 3 after the second patterning step as shown in FIG. 4(a)), followed by ordinary LSI manufacturing steps to etch the film 2. Therefore, it is required that the lower layer has an excellent resistance to etching. In order to improve the etching resistance, the lower layer 3 to be used in the present invention preferably contains at least a benzene ring in a main chain or a side chain as a constituent component. The benzene ring receives energies of high-speed ions and high-speed electrons colliding onto the substrate at the dry etching step, by being bent from a planar structure in an excited state. In other words, the benzene ring acts as an impact buffer against the colliding ions and the like by being bent, whereby the energies of the colliding ions or the like are transformed into small oscillation energies to alleviate the energies and to restore the original planar structure of the benzene ring. Therefore, the photoresist layer containing a benzene ring shows an excellent resistance to dry etching.

The thickness of the lower layer 3 is determined in view of both the etching resistance and the resolution. From the view point of the etching resistance, the lower layer 3 preferably has a larger thickness, whereas from the view point of the resolution, the lower layer 3 preferably has a smaller thickness. Specifically, the lower layer 3 preferably has a thickness within the range of 3000 to 7000 Å. An ordinary mono-layer photoresist requires a thickness of about 5000 Å in view of the etching resistance. However, since the photoresist film of the present invention has a three-layer structure, the etching resistance of the whole three-layer structure is important. Therefore, the lower layer 3 preferably has a thickness of 3000 Å or more. On the other hand, from the view point of the resolution, the lower layer 3 preferably has a thickness of 7000 Å or less. If the thickness is less than 3000 Å, the etching step is restricted to some extent after the pattern is formed by the photoresist pattern forming method of the present invention, so that it is not preferable. On the other hand, if the thickness exceeds 7000 Å, the resolution is restricted to some extent, so that it is not preferable.

The portion of the middle layer 4 exposed to ambient atmosphere after the first patterning step is etched by oxygen plasma until the lower layer 3 is exposed to ambient atmosphere. On the other hand, the middle layer 4 under the portion of the upper layer 5 remaining after the first patterning step is not etched at the beginning of the etching step because it is protected by the upper layer 5. The etching step is carried out until the portion of the middle layer 4 exposed to ambient atmosphere after the first patterning step is completely removed to expose the lower layer 3 to ambient atmosphere, as described before. However, the middle layer 4 under the portion of the upper layer 5 remaining after the first patterning step needs to exist after the etching is ended so as to shield the i-beam or the KrF excimer laser beam at the next step of exposing the entire surface to the laser beam so that the lower layer 3 is not be exposed to the beam. In order to satisfy these conditions, the etching rate of the middle layer 4 is preferably larger than that of the lower layer 3. Specifically, the etching rate of the middle layer 4 effective in practicing the present invention is preferably not less than 1.2 times as large as the etching rate of the lower layer 3. This etching rate is suitably determined depending on the materials of the middle and lower layers and an etchant to be used.

The thickness of the middle layer 4 is determined in view of both the resistance to etching and transmittances to the radiated lights (the light sources are not specifically limited) at the first and second exposure steps. In other words, from the view point of the resistance to etching, the middle layer 4 preferably has a smaller thickness so that the portion of the middle layer exposed to ambient atmosphere after the first patterning step is removed speedily at the half etching step. On the other hand, the middle layer 4 preferably has a larger thickness in order to shield the radiated lights so that the lower layer 3 is not exposed to the lights at the first and second exposure steps. In order to satisfy these conditions, the thickness of the middle layer 4 is preferably within the range of 200 to 2000 Å. If the thickness of the middle layer 4 is smaller than 200 Å, the radiated lights cannot be sufficiently shielded, so that it is not preferable. On the other hand, if the thickness of the middle layer exceeds 2000 Å, the half etching step requires a long period of time, thereby deteriorating the dimension controllability and decreasing the throughput, so that it is not preferable.

The upper layer 5 is patterned at the first patterning step. The portion of the upper layer 5 remaining after the first patterning step acts to protect the middle layer 4 lying thereunder at the later-performed half etching step, especially at the beginning of the etching step. Therefore, the resistance to dry etching and the thickness are required to some degree. On the other hand, from the view point of the resolution, the upper layer 5 preferably has a smaller thickness. From these demands, the etching rate of the upper layer 5 is preferably not more than 1.5 times as large as the etching rate of the lower layer 3. If the etching rate exceeds 1.5 times, the etching at the half etching step reaches the middle layer 4 under the portion of the upper layer 5 remaining after the first patterning step, whereby the radiated lights are not sufficiently shielded by the middle layer 4 at the second exposure step, so that it is not preferable.

The thickness of the upper layer 5 is preferably within the range of 500 to 3000 Å. If the thickness is smaller than 500 Å, the protection of the middle layer 4 under the portion of the upper layer 5 remaining after the first patterning step is insufficient at the half etching step, giving rise to excessive etching of the middle layer 4, whereby the radiated lights are not sufficiently shielded by the middle layer 4 at the second exposure step, so that it is not preferable. On the other hand, if the thickness exceeds 3000 Å, the resolution of the first patterning becomes poor, so that it is not preferable.

According to the method for forming a photoresist pattern of the present invention, the photoresist film of the present invention is first exposed to a KrF or ArF excimer laser beam through the intermediary of a mask, followed by development to transcribe a mask pattern onto the upper layer 5 at the first patterning step.

Then, the portion of the middle layer 4 exposed to ambient atmosphere is etched by means of oxygen plasma until the lower layer 3 is exposed to ambient atmosphere, whereby the pattern transcribed on the upper layer 5 is further transcribed onto the middle layer 4. Subsequently, the entire surface is exposed to an i-beam or a KrF excimer laser beam without using a mask, whereby the pattern transcribed on the middle layer 4 is further transcribed onto the lower layer 3.

In the method for forming a photoresist pattern of the present invention, an acid formed by an acid generator contained in the resist is preferably allowed to be diffused effectively by a heating treatment at the first patterning step to form a good pattern. Further, an acid contained in the resist is preferably allowed to be diffused effectively by a heating treatment at the second patterning step to form a good pattern. These heating treatments are often referred to as PEB (Post Exposure Bake), which is carried out to increase an acid and to alleviate the non-uniformity of acid distribution due to a standing wave when a sufficient amount of the acid has not been obtained by exposure alone. The heating temperature and the heating time are suitably determined by the concentration of the acid, the composition of the resist and the like.

Subsequently, development is carried out. In the present invention, the development is carried out by an ordinary development method. Specifically, the surface of the resist is dipped into, for example, a 2.38% aqueous solution of TMAH (developer solution), followed by drying the developer solution to carry out the development.

The lower layer 3, the middle layer 4 and the upper layer 5 of the present invention can be formed by the spin coating method as is adopted in an ordinary photolithography process. Also, in accordance with the needs, it is preferably to carry steps of making the substrate oleophilic, removing the solvent after the coating step and conducting a heating treatment for curing the resist.

The lower layer 3 may be made of, for example, a novolak resin as a material sensitive to an i-beam, or polyvinyl phenol having its hydroxyl group protected by acetal group, t-butoxycarbonyl group or the like, as a material sensitive to a KrF excimer laser beam.

The middle layer 4 may be made of, for example, a material containing a dye for shielding the radiated lights and an acrylic resin having a high etching rate as a major component.

The upper layer 5 may be made of, for example, polyvinyl phenol having its hydroxyl group protected by acetal group, t-butoxycarbonyl group or the like as a material sensitive to a KrF excimer laser beam. Alternatively, the upper layer 5 may be made of, for example, a terpolymer resist of methacrylic acid, tert-butyl methacrylate and methyl methacrylate, a terpolymer resist of methacrylic acid, tert-butyl methacrylate and adamantyl methacrylate, a tetrapolymer resist of methacrylic acid, tert-butyl methacrylate, methyl methacrylate and isobornyl methacrylate, a tetrapolymer of methacrylic acid, tert-butyl methacrylate, methyl methacrylate and adamantyl methacrylate, or the like as a material sensitive to an ArF excimer laser beam.

EXAMPLES

Example 1

A 6-inch silicon wafer, on which an SiN film of about 0.5 μm thickness was formed, was washed with a diluted hydrofluoric acid solution, followed by drying at a high temperature to treat the wafer surface. Then, the wafer surface was made oleophilic by treating it with hexamethyldisilazane (HMDS).

Subsequently, a lower layer was formed by applying a resist being sensitive to a KrF excimer laser beam and containing polyvinyl phenol as a skeleton resin so that the lower layer would have a thickness shown in Table 1. Then, a middle layer was formed by applying an organic substance having properties shown in Table 1 (transmittances to a KrF excimer laser beam and an ArF excimer laser beam, film thickness and etching rate ratio relative to that of the lower layer). Further, an upper layer was formed by applying a resist being sensitive to an ArF excimer laser beam and having properties shown in Table 1 (film thickness and etching rate ratio relative to that of the lower layer). Here, in Table 1, the first layer represents the lower layer, the second layer represents the middle layer, and the third layer represents the upper layer.

As the resist sensitive to the KrF excimer laser beam, an acetal-type polyhydroxystyrene resin containing an acid generator such as an onium salt was used.

An acetal resin having an alicyclic group side chain, such as adamantane, was used as the resist sensitive to the ArF excimer laser beam.

A polyvinyl alcohol resin was used as the middle layer.

Thereafter, an excimer laser beam was applied by means of an ArF excimer laser exposure apparatus (prototype apparatus manufactured by Nikon Corporation in Japan) so that a line-and-space (L/S) pattern of a mask size of 0.15 μm would be formed, followed by a heating treatment at 120° C. for 90 seconds and development.

Subsequently, an etching treatment was carried out by means of an etching apparatus (product name "P5000" manufactured by Applied Materials Co., Ltd.) using oxygen plasma so that the middle layer exposed to ambient atmosphere by the previous patterning step would be completely removed.

Next, a KrF excimer laser beam was applied onto the entire wafer surface by means of a KrF excimer laser exposure apparatus (product name "FPA-3000 EX3" manufactured by Canon Inc. in Japan), followed by a heating treatment at 105° C. for 90 seconds and development.

The above-mentioned two development steps were carried out by using a developer solution containing TMAH at 2.38%. Then, a cross section of the wafer was observed by an electron microscope. The results are shown together in Table 1.

After the final pattern of the resist was formed, the wafer surface (SiN) was etched to a depth of 0.3 μm by means of a magnetron RIE etching apparatus. Further, a cross section of the wafer was observed by an electron microscope. The results are shown together in Table 1

TABLE 1

| Sample No. | First layer Thickness μm | Second layer Transmittance to ArF (%) | Second layer Transmittance to KrF (%) | Second layer Thickness μm | Second layer Etch rate (times) | Third layer Thickness μm | Third layer Etch rate (times) | Cross section after patterning | Cross section after etching |
|---|---|---|---|---|---|---|---|---|---|
| 1 | 4000 | 60 | 55 | 300 | 1.5 | 1000 | 1.2 | A little decrease in first layer thickness | First layer substantially removed |
| 2 | 4000 | 45 | 40 | 350 | 1.5 | 1000 | 1.2 | good | good |
| 3 | 2500 | 15 | 10 | 600 | 1.5 | 1000 | 1.2 | good | First layer substantially removed |
| 4 | 3000 | 15 | 10 | 600 | 1.5 | 1000 | 1.2 | good | good |
| 5 | 7000 | 15 | 10 | 600 | 1.5 | 1000 | 1.2 | good | good |
| 6 | 8000 | 15 | 10 | 600 | 1.5 | 1000 | 1.2 | A little poor line controllability | A little poor line controllability |
| 7 | 3500 | 50 | 50 | 150 | 1.5 | 1000 | 1.2 | A little decrease in first layer thickness | First layer substantially removed |
| 8 | 3500 | 45 | 45 | 200 | 1.5 | 1000 | 1.2 | good | good |
| 9 | 3500 | 3 | 3 | 2000 | 1.5 | 1000 | 1.2 | good | good |
| 10 | 3500 | 2 | 2 | 2500 | 1.5 | 1000 | 1.2 | A little poor line controllability | A little poor line controllability |
| 11 | 3500 | 15 | 10 | 600 | 1.5 | 450 | 1.2 | A little decrease in first layer thickness | First layer substantially removed |
| 12 | 3500 | 15 | 10 | 600 | 1.5 | 500 | 1.2 | good | good |
| 13 | 3500 | 15 | 10 | 600 | 1.5 | 3000 | 1.2 | good | good |
| 14 | 3500 | 15 | 10 | 600 | 1.5 | 3500 | 1.2 | A little poor line controllability | A little poor line controllability |
| 15 | 3500 | 15 | 10 | 600 | 1 | 1000 | 1.2 | A little decrease in first layer thickness | First layer substantially removed |
| 16 | 3500 | 15 | 10 | 600 | 1.2 | 1000 | 1.2 | good | good |
| 19 | 3500 | 15 | 10 | 600 | 1.5 | 1000 | 1.5 | good | good |
| 20 | 3500 | 15 | 10 | 600 | 1.5 | 1000 | 1.7 | A little decrease in first layer thickness | First layer substantially removed |
| Comp. 1 | 4000 | — | — | — | — | — | — | Images not resolvable, poor patterning | Not etched at all |
| Comp. 1 | 2000 | — | — | — | — | — | — | Nearly good | All the resist removed |
| Comp. 2 | — | — | — | — | — | 5000 | — | Images not resolvable, poor patterning | Not etched at all |
| Comp. 2 | — | — | — | — | — | 3000 | — | Nearly good | All the resist removed |
| Comp. 3 | 4000 | — | — | — | — | 1000 | — | Non-uniform line width | Non-uniform line width |

Comparative Example 1

In Comparative Example 1, only the resist that was used in forming the lower layer of Example 1 was applied to form a photoresist film without the middle layer and the upper layer in the same manner as in Example 1. Then, a KrF excimer laser beam was applied by means of the transformed radiation method (shrink) using a mask of an L/S pattern of a mask size of 0.15 μm, followed by a heating treatment at 110° C. for 90 seconds and development. A cross section of the wafer was observed by an electron microscope. The results are shown in Table 1.

In the case where the thickness was large (about 4000 Å), the resolution was poor. On the other hand, in the case where the thickness was small (about 2000 Å), the wafer could not withstand the etching process due to small thickness, whereby all the resist had been removed when the etching step was ended, failing to provide a normal etching surface, although the patterning was almost good.

Comparative Example 2

In Comparative Example 2, only the resist that was used in forming the upper layer of Example 1 was applied to form a photoresist film in the same manner as in Example 1 without the lower layer and the middle layer. Then, an ArF excimer laser beam was applied by using the same mask as in Example 1, followed by a heating treatment and development. A cross section of the wafer was observed by an electron microscope. The results are shown in Table 1.

After the resist pattern was formed, the wafer surface was etched to a depth of 0.3 μm in the same manner as in Example 1, and its cross section was observed by an electron microscope. The results are shown in Table 1.

In the case where the thickness was large (about 5000 Å), the resolution was poor. On the other hand, in the case where the thickness was small (about 3000 Å), the wafer could not withstand the etching process due to small thickness, whereby all the resist had been removed when the etching step was ended, failing to provide a normal etching surface, although the patterning was almost good.

Comparative Example 3

A photoresist film having a two-layer structure of a lower layer and an upper layer was fabricated without the middle layer of Example 1. Then, an ArF excimer laser beam was applied by using the same mask as in Example 1, followed by a heating treatment and development. Further, a KrF excimer laser beam was applied onto the entire wafer surface, followed by a heating treatment and development. A cross section of the wafer was observed by an electron microscope. The results are shown in Table 1. At the step of exposing the entire surface, all the lower layer was exposed to the light, giving rise to reduced thickness of the lower layer and non-uniform pattern width as shown in FIG. 5(c). A later-performed etching step produced a pattern with non-uniform line width.

Example 2

An 8-inch silicon wafer, on which a polysilicon film of about 0.5 μm thickness was formed, was washed with a sulfuric acid aqueous solution, followed by drying at a high temperature to treat the wafer surface. Then, the wafer surface was made oleophilic by treating it with HMDS. Subsequently, a lower layer was formed by applying a resist being sensitive to an i-beam and containing a novolak resin as a skeleton resin so that the lower layer would have a thickness of 3500 Å. Then, a middle layer was formed by applying an organic substance having a transmittance of 20% to an i-beam, a transmittance of 15% to an ArF excimer laser beam, a film thickness of 800 Å and an etching rate ratio of 1.4 relative to that of the lower layer. Further, an upper layer was formed by applying a resist being sensitive to an ArF excimer laser beam and having a film thickness of 800 Å and an etching rate ratio of 1.2 relative to that of the lower layer.

A novolak resin having a naphthoquinone diazide sensitive group was used as the resist sensitive to the i-beam.

An acetal resin having an alicyclic group side chain, such as adamantane, was used as the resist sensitive to the ArF excimer laser beam.

A polyvinyl alcohol resin was used as the middle layer.

Thereafter, an excimer laser beam was applied by means of the same ArF excimer laser exposure apparatus as in Example 1 so that a line-and-space (L/S) pattern of a mask size of 0.16 µm would be formed, followed by a heating treatment at 120° C. for 90 seconds and development.

Subsequently, an etching treatment was carried out by using oxygen plasma in the same manner as in Example 1 so that the middle layer exposed to ambient atmosphere by the previous patterning step would be completely removed.

Next, an i-beam was applied onto the entire wafer surface by means of an i-beam exposure apparatus (product name "NSR2005i9C" manufactured by Nikon Corporation in Japan), followed by a heating treatment at 105° C. for 90 seconds and development to form a photoresist pattern.

A cross section of the wafer was observed by means of an electron microscope in the same manner as in Example 1. The result showed a good pattern. Further, after the resist pattern was formed in the same manner as in Example 1, the wafer surface was etched to a depth of 0.3 µm by means of a Helicon wave plasma etching apparatus. A cross section of the wafer was observed by means of an electron microscope. The result showed good etching.

Example 3

An 8-inch silicon wafer, on which an SiN film of about 0.3 µm thickness was formed, was washed with a sulfuric acid aqueous solution, followed by drying at a high temperature to treat the wafer surface. Then, the wafer surface was made oleophilic by treating it with hexamethyldisilazane (HMDS). Subsequently, a lower layer was formed by applying a resist being sensitive to an i-beam and containing a novolak resin as a skeleton resin so that the lower layer would have a thickness of 4500 Å. Then, a middle layer was formed by applying an organic substance having a transmittance of 20% to an i-beam, a transmittance of 15% to a KrF excimer laser beam, a film thickness of 650 Å and an etching rate ratio of 1.3 relative to that of the lower layer. Further, an upper layer was formed by applying a resist being sensitive to a KrF excimer laser beam and having a film thickness of 700 Å and an etching rate ratio of 1.3 relative to that of the lower layer.

A novolak resin having a naphthoquinone diazide sensitive group was used as the resist sensitive to the i-beam.

An acetal resin having an alicyclic group side chain, such as adamantane, was used as the resist sensitive to the ArF excimer laser beam.

A polyvinyl alcohol resin was used as the middle layer.

Thereafter, an excimer laser beam was applied by means of an ArF excimer laser exposure apparatus so that a line-and-space (L/S) pattern of a mask size of 0.17 µm would be formed, followed by a heating treatment at 120° C. for 90 seconds and development.

Subsequently, an etching treatment was carried out by means of an etching apparatus using oxygen plasma in the same manner as in Example 1 so that the middle layer exposed to ambient atmosphere by the previous patterning step would be completely removed.

Next, an i-beam was applied onto the entire wafer surface by means of an i-beam exposure apparatus, followed by a heating treatment at 105° C. for 90 seconds and development. Here, the two development steps were carried out by using a developer solution containing TMAH at 2.38%. Then, a cross section of the wafer was observed by means of an electron microscope. The result showed a good pattern.

Further, after the resist pattern was formed in the same manner as in Example 1, the wafer surface was etched to a depth of 0.4 µm by means of a magnetron RIE etching apparatus. A cross section of the wafer was observed by means of an electron microscope. The result showed good etching.

As shown in detail above, the present invention makes it possible to form a photoresist film that can be patterned without causing decrease in the resolution due to the thickness of the resist film and without deteriorating the resistance to dry etching in forming a pattern using an exposure light such as a KrF or ArF excimer laser beam.

Since the lower layer contains a specific constituent component, the resistance to dry etching can be improved.

Since the transmittance of the middle layer is 50% or less, the stability of the pattern dimension can be improved.

Since the lower layer has a predetermined thickness, it is possible to form a photoresist film having excellent resistance to etching and excellent resolution.

Since the middle layer has a predetermined thickness, it is possible to form a photoresist film providing a sufficient shield against the applied light and having a good dimension controllability.

Since the upper layer has a predetermined thickness, it is possible to form a photoresist film maintaining a sufficient light-shielding property of the middle layer and having a good resolution.

Further, the method for forming a pattern of the photoresist film according to the present invention provides a better patterned shape.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

What we claim is:

1. A photoresist film comprising a three-layer structure of a lower layer, a middle layer and an upper layer, wherein the lower and upper layers are photoresist layers, the lower layer is sensitive to a light having a longer wavelength than a light to which the upper layer is sensitive, and the middle layer is a light-shielding film formed of an organic substance that has a transmittance such that the lower layer is not exposed to light to which the lower and upper layers are sensitive.

2. The photoresist film of claim 1, wherein a combination of the lights to which the lower and upper layers are sensitive is selected from the group consisting of a combination of an i-beam and a KrF excimer laser beam, a combination of an i-beam and an ArF excimer laser beam, and a combination of a KrF excimer laser beam and an ArF excimer laser beam.

3. The photoresist film of claim 1, wherein the lower layer is a photoresist layer that contains at least a benzene ring in a main chain or a side chain as a constituent component.

4. The photoresist film of claim 1, wherein the middle layer has a transmittance of 50% or less with respect to each one of the light to which the lower layer is sensitive and the light to which the upper layer is sensitive.

5. The photoresist film of claim 1, wherein the lower layer has a thickness of 3000 to 7000 Å.

6. The photoresist film of claim 1, wherein the middle layer has a thickness of 200 to 2000 Å.

7. The photoresist film of claim 1, wherein the upper layer has a thickness of 500 to 3000 Å.

8. A method of forming a pattern of a photoresist film comprising the steps of:

forming a photoresist film of claim 1 on a layer to be etched;

patterning only the upper layer by applying a light to which the upper layer is sensitive, using a mask of a predetermined shape;

etching the middle layer which has been exposed at the patterning step, until a surface of the lower layer is exposed; and applying a light to which the lower layer is sensitive, over an entire surface to pattern the lower layer.

9. The method of claim 8, wherein a combination of the lights to which the lower and upper layers are sensitive is selected from the group consisting of a combination of an i-beam and a KrF excimer laser beam, a combination of an i-beam and an ArF excimer laser beam, and a combination of a KrF excimer laser beam and an ArF excimer laser beam.

10. The method of claim 8, wherein a heating treatment is conducted after application of light to the upper layer.

11. The method of claim 8, wherein a heating treatment is conducted after application of light to the lower layer.

* * * * *